United States Patent
Cho et al.

(10) Patent No.: US 12,046,656 B2
(45) Date of Patent: Jul. 23, 2024

(54) SEMICONDUCTOR DEVICE INCLUDING SURFACE-TREATED SEMICONDUCTOR LAYER

(71) Applicant: Samsung Electronics Co., Ltd., Suwon-si (KR)

(72) Inventors: Yeonchoo Cho, Seongnam-si (KR); Kyung-Eun Byun, Seongnam-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 324 days.

(21) Appl. No.: 17/405,619

(22) Filed: Aug. 18, 2021

(65) Prior Publication Data

US 2022/0140100 A1     May 5, 2022

(30) Foreign Application Priority Data

Nov. 5, 2020   (KR) .......................... 10-2020-0147086

(51) Int. Cl.
   *H01L 29/45*        (2006.01)
(52) U.S. Cl.
   CPC ............ *H01L 29/45* (2013.01); *H01L 29/452* (2013.01); *H01L 29/456* (2013.01)
(58) Field of Classification Search
   CPC ...... H01L 29/45; H01L 29/452; H01L 29/456
   See application file for complete search history.

(56) References Cited

U.S. PATENT DOCUMENTS

| | | | |
|---|---|---|---|
| 9,306,005 B2 | 4/2016 | Byun et al. | |
| 10,522,664 B2 | 12/2019 | Byun et al. | |
| 2019/0148493 A1 | 5/2019 | Lee et al. | |
| 2020/0243676 A1* | 7/2020 | Tomida | ................... H01L 21/28 |
| 2020/0388680 A1 | 12/2020 | Lee et al. | |

FOREIGN PATENT DOCUMENTS

| | | |
|---|---|---|
| KR | 2015/0062656 A | 6/2015 |
| KR | 2016/0137298 A | 11/2016 |
| KR | 101693663 B1 | 1/2017 |

OTHER PUBLICATIONS

B. J. Eves and G.P. Lopinski, 'Formation and reactivity of high quality halogen terminated Si(111) surfaces' *Surface Science*, vol. 579, 2005, pp. L89-L96.

Min-Hyun Lee et al., 'Two-dimensional Materials Inserted at the Metal/Semiconductor Interface: Attractive Candidates for Semiconductor Device Contacts' *NANO Letters*, Jul. 2018.

* cited by examiner

*Primary Examiner* — Tucker J Wright
(74) *Attorney, Agent, or Firm* — HARNESS, DICKEY & PIERCE, P.L.C.

(57) ABSTRACT

Disclosed is a semiconductor device including a surface-treated semiconductor layer. The semiconductor device includes a metal layer, a semiconductor layer electrically contacting the metal layer and having a surface treated with an element having an electron affinity of about 4 eV or greater, and a two-dimensional (2D) material layer disposed between the metal layer and the semiconductor layer and having a 2D crystal structure.

19 Claims, 7 Drawing Sheets

| Termination | Electron Affinity | Ionization Potential | Band Gap |
|---|---|---|---|
| −OH | 3.51 | 4.31 | 0.80 |
| −H | 3.77 | 4.76 | 0.99 |
| −F | 5.84 | 6.67 | 0.84 |
| −Cl | 4.84 | 5.70 | 0.86 |

SEMICONDUCTOR DEVICE INCLUDING SURFACE-TREATED SEMICONDUCTOR LAYER

CROSS-REFERENCE TO RELATED APPLICATION

This application is based on and claims priority under 35 U.S.C. § 119 to Korean Patent Application No. 10-2020-0147086, filed on Nov. 5, 2020, in the Korean Intellectual Property Office, the disclosure of which is incorporated by reference herein in its entirety.

BACKGROUND

1. Field

Disclosed embodiments relate to a semiconductor device, and more particularly, to a semiconductor device having reduced contact resistivity due to surface-treating of a semiconductor layer.

2. Description of Related Art

A semiconductor device includes a metal layer-semiconductor layer junction at a particular portion thereof to exchange electric signals with an external environment. The metal layer has a lower resistivity than the semiconductor layer and can be more easily wired to the external environment. In this case, however, a contact resistivity is generated due to a hetero-junction between the semiconductor and the metal layer.

To reduce such contact resistivity, there have been proposed various methods for lowering a Schottky energy barrier between a semiconductor layer and a metal layer. For example, a metal layer having a work function of about 4 eV is used as an n-type semiconductor layer and a metal layer having a work function of about 5 eV is used as a p-type semiconductor layer. However, since a phenomenon wherein a work function of a metal layer is pinned on a surface of a semiconductor layer may occur, there is a limit in reducing the Schottky energy barrier regardless of the kind of metal layer used.

SUMMARY

Provided is a semiconductor device having reduced contact resistivity due to surface-treating of a semiconductor layer using a material having an electron affinity.

Additional aspects will be set forth in part in the description which follows and, in part, will be apparent from the description, or may be learned by practice of the presented embodiments of the disclosure.

The semiconductor device according to an embodiment comprises: a metal layer; a semiconductor layer electrically contacting the metal layer and having a surface treated with a surface-treating element, the surface-treating element being an element having an electron affinity of about 4 eV or greater; and a two-dimensional (2D) material layer between the metal layer and the semiconductor layer and having a 2D crystal structure.

In some embodiments, the surface-treating element may be covalently bonded with an element contained in the semiconductor layer.

In some embodiments, the surface-treating element may include a halogen element.

In some embodiments, the surface-treating element may include at least one of fluorine, chlorine, and bromine.

In some embodiments, the 2D material layer may cause the surface-treating element to be pinned on a surface of the semiconductor layer through a van der Waals bond.

In some embodiments, the surface-treating element may form a surface dipole with the element of the semiconductor layer.

In some embodiments, the surface dipole may exceed about 1.2 (a.u.).

In some embodiments, the semiconductor layer may be surface-treated semiconductor layer, and a Schottky energy barrier between the surface-treated semiconductor layer and the metal layer may be about 0.3 eV or less.

In some embodiments, the semiconductor layer may be surface-treated semiconductor layer, the 2D material layer may contact both of the metal layer and the surface-treated semiconductor layer.

In some embodiments, the metal layer may include a first metal layer and a second metal layer disposed to be spaced apart from each other.

In some embodiments, the semiconductor device may further include: an insulating layer on the semiconductor layer; and an electrode on the insulating layer.

In some embodiments, the 2D material layer may include at least one of graphene and nano crystalline graphene (nc-G).

In some embodiments, the 2D material layer may include a transition metal dichalcogenide as a compound of a transition metal and a chalcogen element.

In some embodiments, the transition metal dichalcogenide may include at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

In some embodiments, the 2D material layer may include at least one of TiOx, NbOx, MnOx, VaOx, $MnO_3$, $TaO_3$, $WO_3$, $MoCl_2$, $CrCl_3$, $RuCl_3$, Bila, $PbCl_4$, GeS, GaS, GeSe, GaSe, $PtSe_2$, $In_2Se_3$, GaTe, InS, InSe, InTe, hexagonal BN (h-BN), and phosphorene.

In some embodiments, the 2D material layer may have a doped structure obtained by replacing some elements of the 2D crystal structure with other elements or additionally combining other elements to the 2D crystal structure.

In some embodiments, a thickness of the 2D material layer may be a multiple of a thickness of a single-layered 2D crystal structure.

In some embodiments, the semiconductor layer may include at least one of silicon, germanium, a Group III-V compound semiconductor, a Group II-VI compound semiconductor, a Group IV-VI compound semiconductor, a Group IV-IV compound semiconductor, an oxide semiconductor, or a 2D crystal structure semiconductor having a bandgap.

In some embodiments, the semiconductor device may further include a metal compound between the 2D material layer and the semiconductor layer.

In some embodiments, the metal compound may include a metal oxide.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
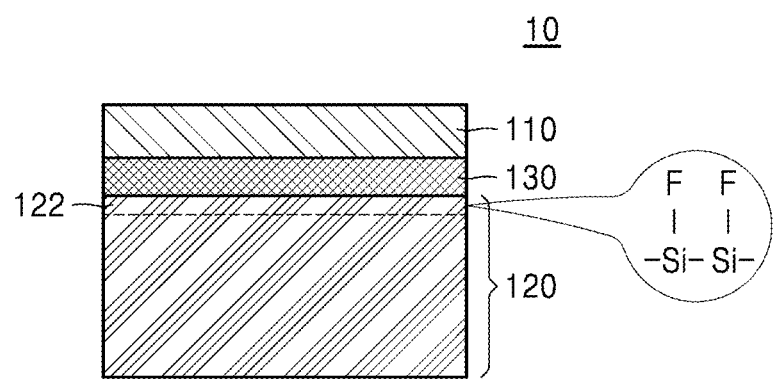
FIG. 1 is a cross-sectional view schematically illustrating a structure of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a semiconductor device including a metal-semiconductor junction will be described in further detail with reference to the accompanying drawings. The following embodiments are presented by way of example only, and various changes and modifications may be made from the description of these embodiments. In the following drawings, the same reference numerals refer to the elements, and the sizes of various components are exaggerated or reduced for clarity and brevity.

In the following embodiments, when an element is referred to as being "above" or "on" another element, it can be directly on the other element in a contact manner or in a non-contact manner.

The terms first, second, etc. are not intended to be limiting but are only used to distinguish one element component, from another. These terms are not intended to limit different materials or structures of constituent elements.

The singular forms are intended to include the plural forms, unless the context clearly indicates otherwise. In addition, it is to be understood that the term "comprising or including" specifies the addition and/or presence of one or more other components, but does not preclude the possibility of excluding the stated components features, unless the content specifically indicates the other way.

The use of the term "the" and an instructional term similar thereto may be applied to both singular forms and the plural forms.

FIG. 1 is a cross-sectional view schematically illustrating a structure of a semiconductor device according to an embodiment. Referring to FIG. 1, the semiconductor device 100 according to an embodiment may include a metal layer 110, a surface-treated semiconductor layer 120 electrically contacting the metal layer 110 and having a surface 122 treated with a material having a relatively high electron affinity, and a two-dimensional (2D) material layer 130 disposed between the metal layer 110 and the semiconductor layer 120 and having a 2D crystal structure.

The metal layer 110 may be made of a metallic material. The metal layer 110 may include, for example, a metal, e.g., magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), or an alloy thereof.

The semiconductor layer 120 may be made of a semiconductor material. For example, the semiconductor layer 120 may be a Group IV semiconductor, e.g., silicon (Si) or germanium (Ge), a Group III-V compound semiconductor, e.g., GaAs or GaP, a Group II-VI compound semiconductor, e.g., CdS or ZnTe, a Group IV-VI compound semiconductor, e.g., PbS, a Group IV-IV compound semiconductor, e.g., SiC, an oxide semiconductor, e.g., IGZO, or a 2D crystal structure semiconductor having a band gap, e.g., $MoS_2$.

The semiconductor layer 120 may electrically contact the metal layer 110, and a surface 122 thereof electrically contacting the metal layer 110 may be surface-treated with an element having a high electron affinity. The element may be used in surface treating the surface of the semiconductor layer 120 using a plasma process or an etching process. The surface-treating element T may be covalently bonded with a semiconductor element S contained in the semiconductor layer 120, and may be arranged on the surface 122 of the semiconductor layer 120 to face further outward than the semiconductor element S, as illustrated in FIG. 1.

Since the surface 122 of the semiconductor layer 120 is treated with an element having a high electron affinity, contact resistivity between the semiconductor layer 120 and the metal layer 110 may be lowered. Specifically, the surface 122 of the semiconductor layer 120 may have a greater surface dipole with a higher electron affinity, and thus a Schottky energy barrier between the metal layer 110 and the semiconductor layer 120 may be lowered. As such, the contact resistivity between the semiconductor layer 120 and the metal layer 110 may be reduced.

Figures 2, 3:
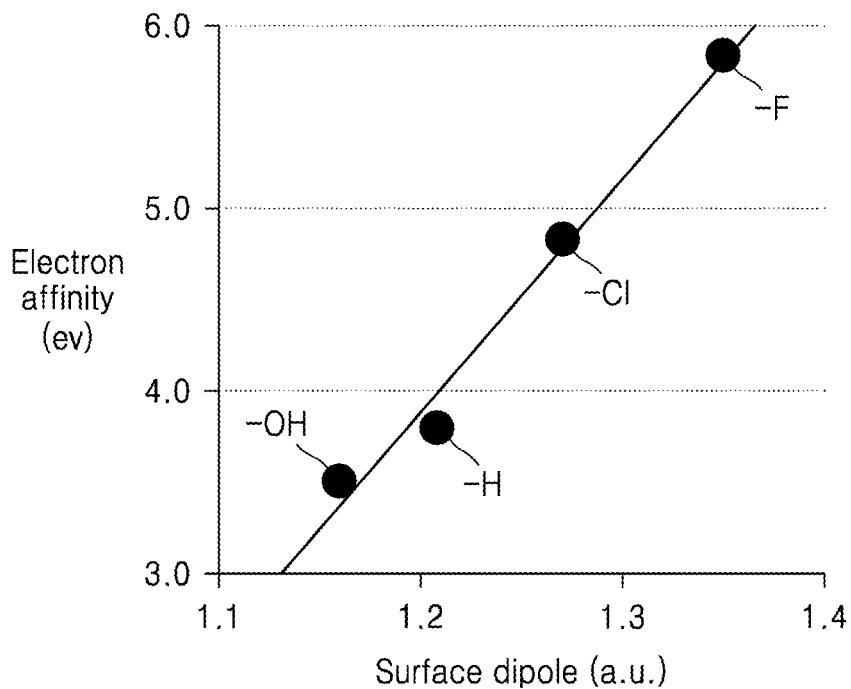
FIG. 2 is a diagram illustrating a relationship between an electron affinity of a surface-treating element and a surface dipole of a semiconductor layer, according to an embodiment.
FIG. 3 illustrates a relationship between an electron affinity of a surface-treating element and a band gap energy of a semiconductor layer, according to an embodiment.

FIG. 2 is a diagram illustrating a relationship between an electron affinity of a surface-treating element and a surface dipole of a semiconductor layer, according to an embodiment. As illustrated in FIG. 2, it is confirmed that the surface dipole of the semiconductor layer 120 and the electron affinity of the surface-treating element T are in proportion to each other. This indicates that the surface 122 of the semiconductor layer 120 may have an increased surface dipole by treating the surface 122 of the semiconductor layer 120 with an element having a higher electron affinity. Particularly, a surface dipole exceeding about 1.2 (a.u.) may be formed by using an element having an electron affinity of about 4 eV or greater.

In addition, even when the surface 122 of the semiconductor layer 120 is treated with an element having a high electron affinity, the semiconductor layer 120 can retain an intrinsic nature of a semiconductor.

FIG. 3 illustrates a relationship between an electron affinity of a surface-treating element and a band gap energy of a semiconductor layer, according to an embodiment. As illustrated in FIG. 3, it is confirmed that an element having a higher electron affinity has a higher ionization potential. However, the semiconductor layer 120 has a substantially constant band gap energy, irrespective of electron affinity of the surface-treating element T. This may confirm that an intrinsic semiconductor property of the semiconductor layer 120 is retained even if the semiconductor layer 120 is surface-treated with an element having a high electron affinity.

Figure 4A:
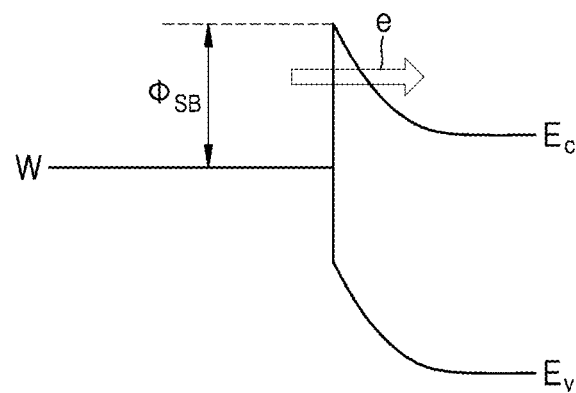
FIG. 4A conceptually illustrates an energy band diagram between a metal layer and a semiconductor layer that is not surface-treated as a comparative example.

FIG. 4A conceptually illustrates an energy band diagram between a metal layer and a semiconductor layer that is not surface-treated as a comparative example. In FIG. 4A, Ec indicates a conduction band level of the semiconductor layer 120, Ev indicates a valence band level of the semiconductor layer 120, and W indicates a work function of the metal layer 110. Referring to FIG. 4A, the work function of the metal layer 110 is much lower than that of the conduction band level of the semiconductor layer 120, and thus a high Schottky energy barrier is generates at an interface between the semiconductor layer 120 and the metal layer 110. Therefore, contact resistivity may be increased at a contact surface of the semiconductor layer 120 and the metal layer 110.

Figure 4B:
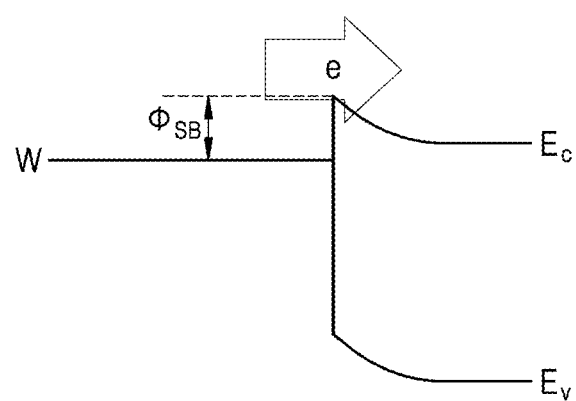
FIG. 4B conceptually illustrates an energy band diagram between a metal layer and a surface-treated semiconductor layer according to an embodiment.

FIG. 4B conceptually illustrates an energy band diagram between a metal layer and a surface-treated semiconductor layer according to an embodiment. Since the surface 122 of the semiconductor layer 120 is surface-treated with an element having a high electron affinity, the conduction band level of the semiconductor layer 120 is lowered. Thus, the Schottky energy barrier may be lowered at the interface between the semiconductor layer 120 and the metal layer 110, and contact resistivity at the contact surface of the semiconductor layer 120 and the metal layer 110 may be reduced.

Meanwhile, the semiconductor device may further include a 2D material layer 130 disposed between the metal layer 110 and semiconductor layer 120 and having a 2D crystal structure.

The 2D material layer 130 includes a 2D material having a 2D crystal structure, and thus may have a layered structure. Layers of the 2D material layer 130 may interact with each other by a van der Waals bond. Therefore, the 2D material layer 130 may be formed on a layer-by-layer basis, and thus a thickness thereof may be easily adjusted.

The 2D material layer 130 may include a carbon-based 2D material or a non-carbon based 2D material. The carbon-based 2D material may be formed in a crystal of a carbon element, for example, graphene or nano crystalline graphene (nc-G). General graphene is formed on a catalyst metal layer using a chemical vapor deposition (CVD) process, requiring a high-temperature process of about 700° C. to 1000° C., and a grain size thereof is about several micrometers. The general graphene may grow on a metal layer including, e.g., nickel (Ni) or copper (Cu), and thus may be transferred to another layer, like a semiconductor layer, after growth. However, nano crystalline graphene may be formed at a relatively low temperature of about 600° C. using an inductively coupled plasma CVD (ICP-CVD) process or a plasma enhanced CVD (PE-CVD) process, and a grain size thereof is about 100 nm or less. The nano crystalline graphene may grow even on the semiconductor layer 120 made of, for example, silicon, at a relatively low temperature.

The non-carbon based 2D material is a 2D material including elements other than carbon. A typical non-carbon based 2D material includes a transition metal dichalcogenide (TMD) that is a compound of a transition metal and a chalcogen element. For example, the transition metal dichalcogenide may include $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$. There are various non-carbon based 2D materials other than the transition metal dichalcogenide. For example, the non-carbon based 2D material may include hexagonal BN (h-BN), phosphorene, TiOx, NbOx, MnOx, VaOx, $MnO_3$, $TaO_3$, $WO_3$, $MoCl_2$, $CrCl_3$, $RuCl_3$, Bila, $PbCl_4$, GeS, GaS, GeSe, GaSe, $PtSe_2$, $In_2Se_3$, GaTe, InS, InSe, and InTe. The h-BN is formed in a hexagonal crystal structure by combining boron (B) and nitrogen (N). The phosphorene is a 2D allotropy of black phosphorus.

Although any of the above materials may be used for the 2D material layer 130, when the semiconductor layer 120 is a semiconductor layer having a 2D crystal structure, the material of the 2D material layer 130 may be chosen to be different from that of the semiconductor layer 120.

In addition, the 2D material layer 130 may use the above materials without modifying them, and/or the materials may be doped to further improve electrical characteristics of the semiconductor device 100. In other words, the 2D material layer 130 may have a doped structure by replacing some of elements forming the 2D crystal structure of the 2D material layer 130 with other elements or additionally combining other elements to the 2D crystal structure. For example, when the 2D material layer 130 includes graphene, some of the carbon atoms may be replaced with or combined with other elements, e.g., boron or nitrogen.

Since there is no reactive group on the surface 122 of the 2D material layer 130, the work function of the metal layer 110 may eliminate a phenomenon that the work function of the metal layer 110 is pinned on the surface 122 of the semiconductor layer 120. Therefore, an inherent work function of the metal layer 110 may be exhibited, thereby consequently lowering contact resistivity between the metal layer 110 and the semiconductor layer 120.

Additionally, the 2D material layer 130 may limit and/or prevent the surface-treating element T from being diffused to another layer, for example, the metal layer 110, by pinning the surface-treating element T on the semiconductor layer 120. The surface-treating element T may be covalently bonded with an element S contained in the semiconductor layer 120. However, a bond of the surface-treating element T with the element S of the semiconductor layer 120 may be cut by a semiconductor device manufacturing process or other conditions. The surface-treating element T separated from the material of the semiconductor layer 120 may be diffused into the semiconductor layer 120 or the metal layer 110.

Figure 5A:
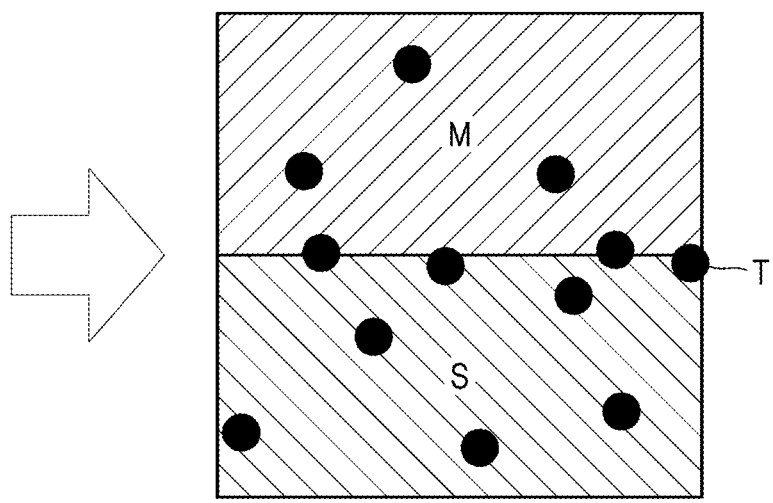
FIG. 5A is a reference view for explaining a state in which surface-treating elements are diffused when there is no two-dimensional material layer.

FIG. 5A is a reference view for explaining a state in which surface-treating elements are diffused when there is no 2D material layer. As illustrated in FIG. 5A, when the bond of the surface-treating element T with the element S of the semiconductor layer 120 is cut, the element, the bond of which is cut, may be diffused into the semiconductor layer 120 or the metal layer 110. Thus, a surface treating effect of the semiconductor layer 120 may disappear, and a Schottky energy barrier between the metal layer 110 and the semiconductor layer 120 may be changed.

Figure 5B:
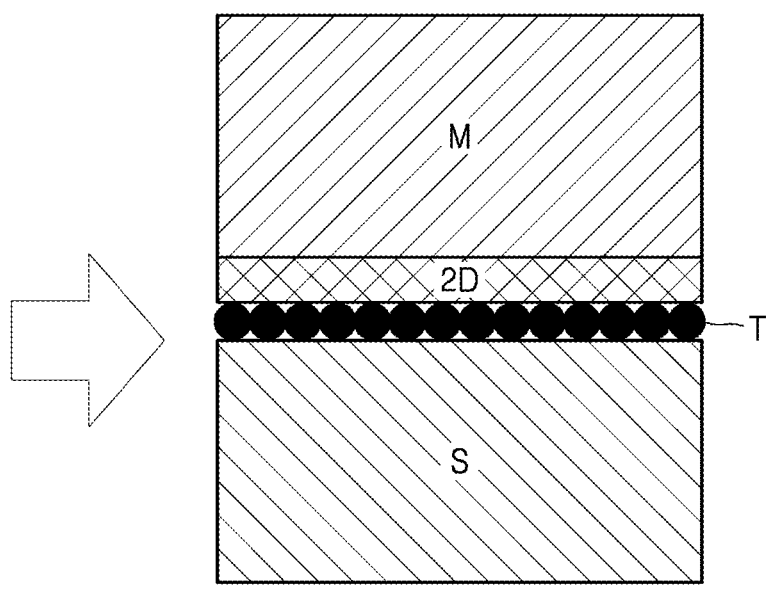
FIG. 5B is a reference view for explaining a relationship between a two-dimensional (2D) material layer and a surface-treated semiconductor layer.

FIG. 5B is a reference view for explaining a relationship between a two-dimensional (2D) material layer and a surface-treated semiconductor layer. As illustrated in FIG. 5B, the 2D material layer 130 is disposed on the surface-treated semiconductor layer 120. Materials contained in the 2D material layer 130 may interact with each other due to a van der Waals bond. Accordingly, even if the bond of the surface-treating element T with the element S of the semiconductor layer 120 is cut, the surface-treating element T may not be diffused into the metal layer 110 due to the 2D material layer 130. In addition, the surface-treating element T may also be bonded with the materials contained in the 2D material layer 130 through a van der Waals bond, and thus may not be diffused into the semiconductor layer 120. Thus, the 2D material layer 130 may limit and/or prevent the Schottky energy barrier from being changed by pinning the surface-treating element T on the surface 122 of the semiconductor layer 120.

Additionally, the 2D material layer 130 generally has high thermal stability, thereby improving durability of the semiconductor device 100. Moreover, the 2D material layer 130 may serve as a diffusion barrier for semiconductor atoms and metal atoms, and it is not necessary to form a separate diffusion barrier between the metal layer 110 and the semiconductor layer 120. Therefore, the overall resistivity of the semiconductor device 100 may be further reduced.

Figure 6:
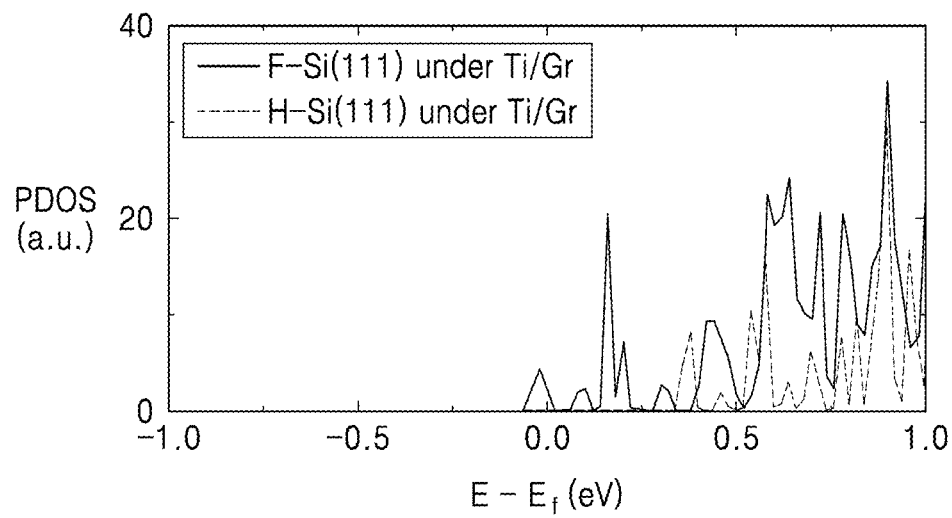
FIG. 6 illustrates a simulation result regarding projected densities of states (PDOS) of a surface-treating element according to an embodiment.

FIG. 6 illustrates a simulation result of projected density of states (PDOS) of a surface-treating element according to an embodiment. For simulation of PDOS, the metal layer 110 was formed using titanium (Ti), the 2D material layer 130 was formed using graphene, and the semiconductor layer 120 was formed using silicon (Si). The semiconductor layer 120 was subjected to surface treatment using fluorine (F) in Example 1 and hydrogen in Example 2.

The result of Example 1 confirmed that a Schottky energy barrier (E-Ef) between the metal layer 110 and the semiconductor layer 120 became close to about 0. In addition, the result of Example 2 confirmed that a Schottky energy barrier (E-Ef) between the metal layer 110 and the semiconductor layer 120 was lowered to about 0.3 eV. It may be confirmed that the Schottky energy barrier may be changed according to the kind of surface-treating element T, and it may also be confirmed that an element having a high electron affinity can significantly reduce a Schottky energy barrier. Therefore, according to an embodiment, the Schottky energy barrier can be significantly reduced by surface-treating the semiconductor layer 120 with an element having an electron affinity of about 4 eV or greater.

The semiconductor device including the surface-treated semiconductor layer 120 may be implemented as various types of devices. For example, the semiconductor device may be implemented as a transistor, a light-emitting device, a detecting device, an interconnector, etc. by selectively further comprising an insulating layer or an electrode.

Figure 7:
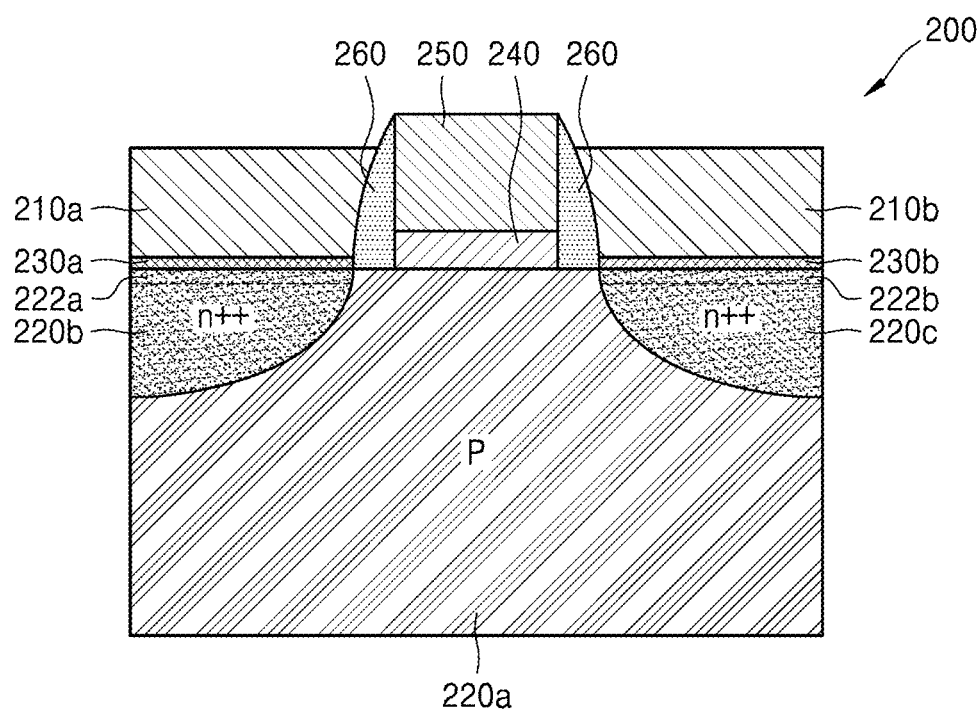
FIG. 7 illustrates a semiconductor device implemented as a transistor according to an embodiment.

FIG. 7 illustrates a semiconductor device implemented as a transistor according to an embodiment. As illustrated in FIG. 7, the semiconductor device 200 may include first and second metal layers 210*a* and 210*b* spaced apart from each other, semiconductor layers 220*a*, 220*b*, and 220*c* electrically contacting the first and second metal layers 210*a* and 210*b*, and 2D material layers 230*a* and 230*b* disposed between the first and second metal layers 210*a* and 210*b* and the semiconductor layers 220*a*, 220*b*, and 220*c*, respectively.

The first and second metal layers 210*a* and 210*b* may be a source electrode and a drain electrode of a transistor, respectively, and may correspond to the metal layer 110 shown in FIG. 1.

The semiconductor layers 220*a*, 220*b*, and 220*c* may function as a channel of a transistor, and may correspond to the semiconductor layer 120 shown in FIG. 1. Specifically, the semiconductor layers 220*a*, 220*b*, and 220*c* may include, for example, a well region 220*a* doped to have a first conductivity type and a source region 220*b* and a drain region 220*c* doped to have a second conductivity type electrically opposite to the first conductivity type. Although FIG. 1 illustrates that the well region 220*a* is doped to a p-type conductivity and the source and drain regions 220*b* and 220*c* are doped to an n-type conductivity, this is a mere example and the well region 220*a* may be doped to an n-type conductivity and the source and drain regions 220*b* and 220*c* may be doped to a p-type conductivity. The well region 220*a* may be doped to a relatively low concentration, and the source and drain regions 220*b* and 220*c* may be doped to a relatively high concentration to reduce a depletion width.

Meanwhile, surfaces 222*a* and 222*b* of the semiconductor layers 220*b* and 220*c*, contacting the first and second metal layers 210*a* and 210*b*, may be treated with an element having a high electron affinity. The surface-treating element may have an electron affinity of, for example, 4 eV or greater. The surfaces 222*a* and 222*b* of the semiconductor layers 220*b* and 220*c* may have an increased electron dipole by surface-treating the same with an element having a high electron affinity. Thus, a Schottky energy barrier may be lowered at interfaces between the semiconductor layers 220*b* and 220*c* and the metal layers 210*a* and 210*b*, thereby reducing contact resistivity. The electron dipole on the surface-treated surfaces 222*a* and 222*b* of the semiconductor layers 220*b* and 220*c* may exceed about 1.2 (a.u.).

In addition, the semiconductor device may further include a gate insulating film 240 disposed on the well region 220*a* between the source region 220*b* and the drain region 220*c*, a gate electrode 250 disposed on the gate insulating film 240, and a spacer 260 surrounding sidewalls of the gate insulating film 240 and the gate electrode 250. The spacer 260 may limit and/or prevent the gate insulating film 240 and the gate electrode 250 from directly contacting the first and second metal layers 210*a* and 210*b*. The gate insulating film 240 may be formed of $SiO_2$, SiNx, $HfO_2$, or $Al_2O_3$, and the gate electrode 250 may be formed of polysilicon or the same metal material as the metal layer 110. The spacer 260 may be formed of an insulating material, such as $SiO_2$, or SiNx.

The semiconductor device shown in FIG. 7 is a unipolar metal oxide silicon field effect transistor (MOSFET) in which the well region 220a is doped to have a polarity opposite to the source and drain regions 220b and 220c. However, the above-described principle may be applied not only to the unipolar MOSFET but also to any semiconductor device having hetero-junction between metal and semiconductor. For example, even when all regions of semiconductor layers 220a, 220b, and 220c are undoped or are doped to the same polarity, contact resistivity may be reduced by interposing a 2D between a semiconductor layer and a metal layer.

Figure 8:
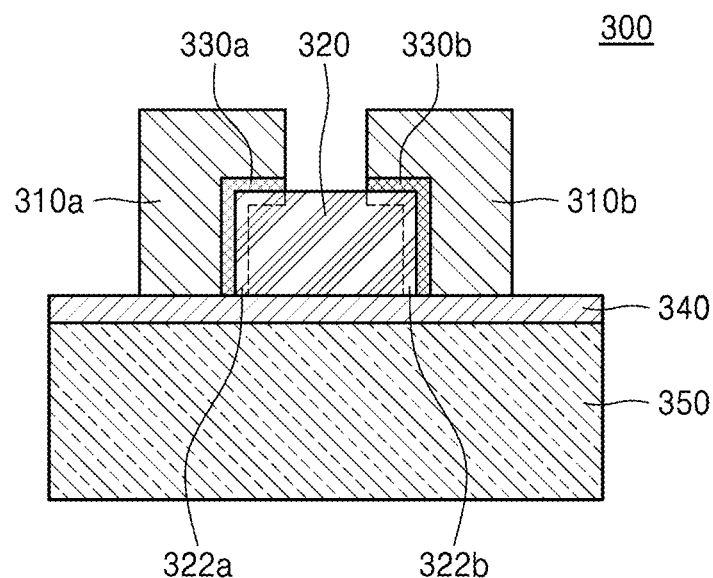
FIG. 8 is a cross-sectional view schematically illustrating a structure of a semiconductor device according to another embodiment.

FIG. 8 is a cross-sectional view schematically illustrating a structure of a semiconductor device according to another embodiment. Referring to FIG. 8, the semiconductor device 300 may include a gate electrode 350, a gate insulating film 340 disposed on the gate electrode 350, a semiconductor layer 320 disposed on the gate insulating film 340, first and second metal layers 310a and 310b disposed at opposite sides of the semiconductor layer 320 and electrically contacting the semiconductor layer 320, and 2D material layers 330a and 330b disposed between the semiconductor layer 320 and the first and second metal layers 310a and 310b and having a 2D crystal structure. The semiconductor layer 320 may function as a channel layer and may be undoped.

The first and second metal layers 310a and 310b may be disposed on the gate insulating film 340, and may include a source electrode facing one side of the semiconductor layer 320 and a drain electrode disposed on the gate insulating film 340 and facing the other side of the semiconductor layer 320. In addition, the gate electrode 350 may also be formed of a metal material. The above-described materials may be used as the metal material of the gate electrode 350, and the first and second metal layers 310a and 310b.

Surfaces 322a and 322b contacting the first and second metal layers 310a and may be treated with an element having a high electron affinity, and a surface of semiconductor layer contacting the gate insulating film 340 may not be treated with the element having a high electron affinity. The surface-treating element may have an electron affinity of, for example, 4 eV or greater. The surfaces 322a and 322b of the semiconductor layer 320 may have an increased electron dipole by surface-treating the same with an element having a high electron affinity. Thus, a Schottky energy barrier may be lowered at interfaces between the semiconductor layer 320 and the metal layers 310a and 310b, thereby reducing contact resistivity. The electron dipole on the surfaces 322a and 322b of the semiconductor layer 320 may exceed about 1.2 (a.u.).

The 2D material layers 330a and 330b may include a first 2D material layer 330a disposed between the first metal layer 310a and one side of the semiconductor layer 320, and a second 2D material layer 330b disposed between the second metal layer 310b and the other side of the semiconductor layer 320. As illustrated in FIG. 8, the first 2D material layer 330a may extend from one side surface of the semiconductor layer 320 to a partial region of an upper surface thereof. In addition, the second 2D material layer 330b may extend from the other side surface of the semiconductor layer 320 to another partial region of the upper surface thereof so as not to contact the first 2D material layer 330a. Accordingly, the 2D material layers 330a and 330b may be bent at about 90° C. between the side surface of the semiconductor layer 323 and the upper surface thereof. The 2D material layers 330a and 330b may include the above-described 2D materials. Specifically, non-carbon based 2D crystals including elements other than carbon may be used as the 2D material layers 330a and 330b.

Figure 9:
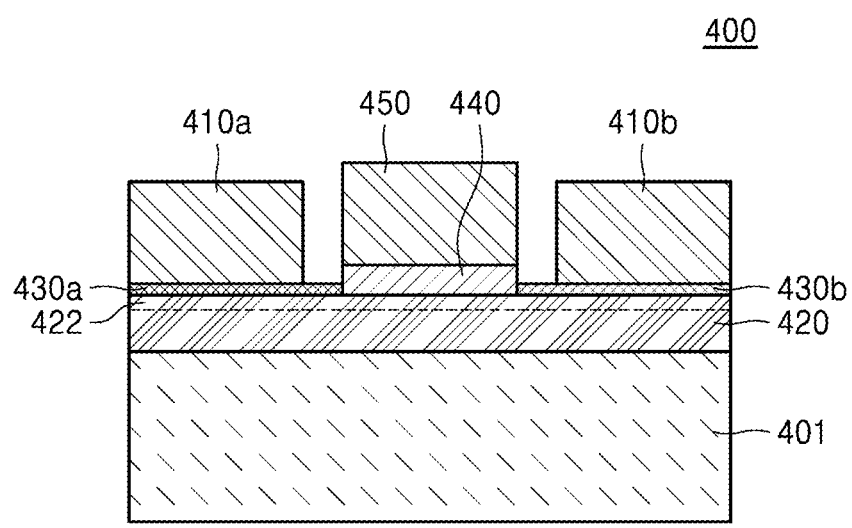
FIG. 9 is a cross-sectional view schematically illustrating a structure of a semiconductor device according to still another embodiment.

FIG. 9 is a cross-sectional view schematically illustrating a structure of a semiconductor device according to still another embodiment. The semiconductor device 300 of FIG. 8 has a bottom gate structure in which the gate electrode 350 is disposed under the semiconductor layer 320 and differs from the semiconductor device 400 of FIG. 9 in that the latter has a top gate structure. Referring to FIG. 9, the semiconductor device 400 may include a substrate 401, a semiconductor layer 420 disposed on an upper surface of the substrate 401, a gate insulating film 440 disposed in a region of an upper surface of the semiconductor layer 420, a gate electrode 450 disposed on an upper surface of the gate insulating film 440, 2D material layers 430a and 430b disposed on another region of the upper surface of the semiconductor layer 420, and first and second metal layers 410a and 410b respectively disposed on upper surfaces of the 2D material layers 430a and 430b. The semiconductor layer 420 may function as a channel layer and may be undoped.

The 2D material layers 430a and 430b may include a first 2D material layer 430a and a second 2D material layer 430b disposed adjacent to opposite side surfaces of the gate insulating film 440 on the upper surface of the semiconductor layer 420. For example, the gate insulating film 440 may be disposed in a central area of the upper surface of the semiconductor layer 420, and the first 2D material layer 430a and the second 2D material layer 430b may be disposed at the opposite sides of the gate insulating film 440. While FIG. 9 illustrates that the first and second 2D material layers 430a and 430b completely contact with the gate insulating film 440, the first and second 2D material layers 430a and 430b may be spaced apart from the gate insulating film 440. In this case, a part of the upper surface of the semiconductor layer 420 may be exposed between the gate insulating film 440 and the first and second 2D material layers 430a and 430b.

In addition, the metal layers 410a and 410b may include a first metal layer 410a disposed on the first 2D material layer 430a and a second metal layer 410b disposed on the second 2D material layer 430b. The first and second metal layers 410a and 410b may serve as source and drain electrodes, respectively. The first and second metal layers 410a and 410b and the 2D material layers 430a and 430b may include the same materials as described with reference to FIG. 8. As illustrated in FIG. 9, metal layers 410a and 410b may be partially arranged on a first 2D material layer 430a and a second 2D material layer 430b, respectively, and may be separated from a gate insulating film 440. Therefore, portions of upper surfaces of the first 2D material layer 430a and the second 2D material layer 430b may be exposed. However, the first and second metal layers 410a and 410b may completely cover the entire surfaces of the first 2D material layer 430a and the second 2D material layer 430b.

A surface 422 of the semiconductor layer 420 contacting the first and second metal layers 410a and 410b may be surface-treated with an element having a high electron affinity. The surface-treating element may have an electron affinity of, for example, 4 eV or greater. The surface 422 of the semiconductor layer 420 may have an increased electron dipole by surface-treating the same with an element having a high electron affinity. Thus, a Schottky energy barrier may be lowered at interfaces between the semiconductor layer 420 and the metal layers 410a and 410b, thereby reducing contact resistivity. The electron dipole on the surface 422 of the surface-treated semiconductor layer 420 may exceed 1.2 (a.u.).

Figure 10:
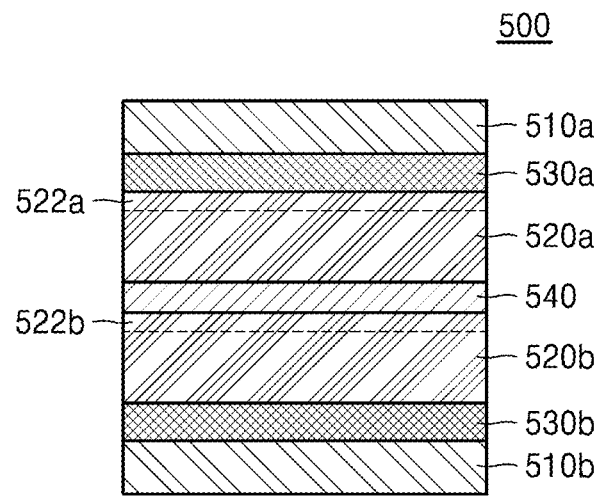
FIG. 10 illustrates a semiconductor device implemented as a light-emitting device according to an embodiment.

FIG. 10 illustrates a semiconductor device implemented as a light-emitting device according to an embodiment. As illustrated in FIG. 10, the semiconductor device may include first and second metal layers 510*a* and 510*b* disposed to be spaced apart from each other, first and second semiconductor layers 520*a* and 520*b* electrically contacting the first and second metal layers 510*a* and 510*b*, respectively, first and second 2D material layers 530*a* and 530*b* disposed between the first metal layer 510*a* and the first semiconductor layer 520*a* and between the second metal layer 510*b* and the second semiconductor layer 520*b*, respectively, and an active layer 540 disposed between the first semiconductor layer 520*a* and the second semiconductor layer 520*b*.

The first and second metal layers 510*a* and 510*b* may serve as respective electrodes of the light-emitting device and may corresponding to the metal layer 110 shown in FIG. 1.

The first semiconductor layer 520*a* may be disposed on the first metal layer 510*a* and may include, for example, an n-type semiconductor. However, the material of the first metal layer 510*a* is not limited to that described above, and, in some cases, the first semiconductor layer 520*a* may include a p-type semiconductor. The first semiconductor layer 520*a* may include a Group III—V based n-type semiconductor, e.g., n-GaN. The first semiconductor layer 520*a* may have a single-layered structure of a multi-layered structure. For example, the first semiconductor layer 520*a* may include any one semiconductor material of InAlGaN, GaN, AlGaN, InGaN, AlN, InN, and may include a semiconductor layer doped with a conductive type dopant, such as Si, Ge, or Sn.

The second semiconductor layer 520*b* may be disposed on the second metal layer 510*b* and may include a semiconductor layer of a conductivity type different from that of the first semiconductor layer 520*a*. For example, the second semiconductor layer 520*b* may include a p-type semiconductor layer 120. The second semiconductor layer 520*b* may include, for example, InAlGaN, GaN, AlGaN and/or InGaN, and may be a semiconductor layer doped with a conductive type dopant, such as Mg.

The active layer 540 may be disposed between the first semiconductor layer 120 and the second semiconductor layer 120 to generate light while electrons and holes are combined with each other, and may have a multi-quantum well (MQW) structure or a single-quantum well (SQW) structure. The active layer 540 may include a Group III-V based semiconductor, e.g., InGaN, GaN, AlGaN, or AlInGaN. A clad layer (not shown) doped with a conductive type dopant may be formed on and/or under the active layer 540. As an example, the clad layer may be implemented as an AlGaN layer or an InAlGaN layer.

Surfaces 522*a* and 522*b* contacting the first and second metal layers 510*a* and 510*b* may be treated with an element having a high electron affinity. The surface-treating element may have an electron affinity of, for example, 4 eV or greater. The surfaces 522*a* and 522*b* of the semiconductor layers 520*a* and 520*b* may have an increased electron dipole by surface-treating the same with an element having a high electron affinity. Thus, a Schottky energy barrier may be lowered at interfaces between the metal layers 510*a* and 510*b* and the semiconductor layers 520*a* and 520*b*, thereby reducing contact resistivity. The electron dipole on the surfaces 522*a* and 522*b* of the surface-treated semiconductor layers 520*a* and 520*b* may exceed about 1.2 (a.u.).

While the semiconductor device operating as a light-emitting device has been described in FIG. 10, example embodiments are not limited thereto. The semiconductor device may also operate as a detector.

Figure 11:
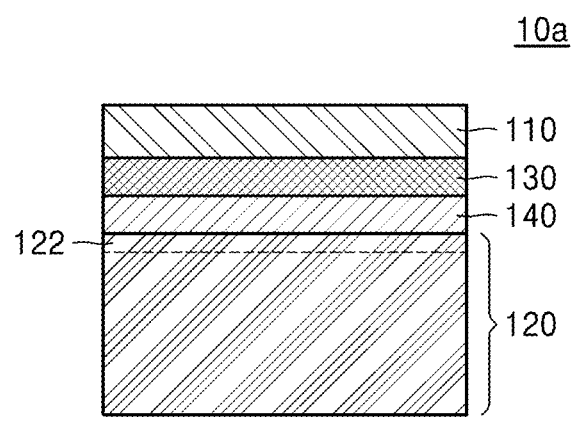
FIG. 11 illustrates a semiconductor device according to another embodiment.

FIG. 11 illustrates a semiconductor device according to another embodiment. Compared with FIG. 1, FIG. 11 illustrates a semiconductor device 10*a* further including a metal compound layer 140 between a semiconductor layer 120 and a 2D material layer 130. The metal compound layer 140 may include a metal oxide. However, the material of the metal compound layer 140 is not limited thereto. The metal compound layer 140 may further include, for example, a semiconductor compound, such as metal silicide, silicon carbide.

The same metal as that used for the metal layer 110 may be used for the metal compound layer 140, but the metal used for the compound layer 140 may not be the same as that used for the metal layer. The metal compound layer 140 may include, for example, a metal, e.g., magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), or an alloy thereof.

The semiconductor material included in the metal compound layer 140 may be the same as that included in the semiconductor layer, but not limited thereto.

The metal compound layer 140 may be formed while a metal film is formed on the semiconductor layer 120 and a 2D material layer 130 is formed on the metal film. In the course of forming the 2D material layer after forming the metal film, a reaction source, such as carbon, hydrogen or oxygen, reacts with the metal film, and a metal compound layer may then be formed. Specifically, when oxygen approaches a metal film, the oxygen reacts with a metal in the metal film to form a metal oxide, making the oxygen difficult to approach a semiconductor layer. Thus, it is possible to inhibit or prevent a semiconductor oxide film from being formed on the semiconductor layer, thereby preventing contact resistivity from increasing. Additionally, a portion of the metal in the metal film may react with a material of the semiconductor layer may become a metal-semiconductor compound.

Thus far, example embodiments of semiconductor devices including a metal-semiconductor have been described and shown in the accompanying drawings, for a better understanding of the technical principles. However, it should be understood that such example embodiments described herein should be considered in a descriptive sense only and not for purposes of limitation. Also, it should be understood that the scope of the present disclosure is not limited to the example embodiments described above. This is because various changes in form and details may be made by those of ordinary skill in the art.

In the disclosed semiconductor device, a semiconductor layer is surface-treated with a material having a high electron affinity to increase a surface dipole of the semiconductor layer, thereby reducing contact resistivity between the semiconductor layer and a metal layer.

In addition, an element used in surface-treating a semiconductor layer may be pinned by providing a 2D material layer on the surface-treated semiconductor layer, thereby limiting and/or preventing contact resistivity from being changed.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a metal layer;
a semiconductor layer electrically contacting the metal layer and having a surface treated with a surface-treating element, the surface-treating element being an element having an electron affinity of about 4 eV or greater; and
a two-dimensional (2D) material layer between the metal layer and the semiconductor layer and having a 2D crystal structure, wherein
the surface-treating element comprises fluorine.

2. The semiconductor device of claim 1, wherein the surface-treating element is covalently bonded with an element contained in the semiconductor layer.

3. The semiconductor device of claim 1, wherein the surface-treating element includes a halogen element.

4. The semiconductor device of claim 1, wherein the 2D material layer causes the surface-treating element to be pinned on a surface of the semiconductor layer through a van der Waals bond.

5. The semiconductor device of claim 1, wherein the surface-treating element forms a surface dipole with an element of the semiconductor layer.

6. The semiconductor device of claim 1,
the 2D material layer prevents the surface-treating element from diffusing into the metal layer by a van der Waals bond.

7. The semiconductor device of claim 1, wherein
the semiconductor layer is a surface-treated semiconductor layer, and
a Schottky energy barrier between the surface-treated semiconductor layer and the metal layer is about 0.3 eV or less.

8. The semiconductor device of claim 1, wherein
the semiconductor layer is a surface-treated semiconductor layer, and
the 2D material layer contacts both of the metal layer and the surface-treated semiconductor layer.

9. The semiconductor device of claim 1, wherein the metal layer includes a first metal layer and a second metal layer that are spaced apart from each other.

10. The semiconductor device of claim 1, further comprising:
an insulating layer on the semiconductor layer; and
an electrode on the insulating layer.

11. The semiconductor device of claim 1, wherein the 2D material layer includes at least one of graphene and nano crystalline graphene (nc-G).

12. The semiconductor device of claim 1, wherein the 2D material layer includes a transition metal dichalcogenide as a compound of a transition metal and a chalcogen element.

13. The semiconductor device of claim 12, wherein the transition metal dichalcogenide includes at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

14. The semiconductor device of claim 1, wherein the 2D material layer includes at least one of $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, hexagonal BN (h-BN), and phosphorene.

15. The semiconductor device of claim 1, wherein the 2D material layer has a doped structure obtained by replacing some elements of the 2D crystal structure with other elements or additionally combining other elements to the 2D crystal structure.

16. The semiconductor device of claim 1, wherein a thickness of the 2D material layer is a multiple of a thickness of a single-layered 2D crystal structure.

17. The semiconductor device of claim 1, wherein the semiconductor layer includes at least one of silicon, germanium, a Group III-V compound semiconductor, a Group II-VI compound semiconductor, a Group IV-VI compound semiconductor, a Group IV-IV compound semiconductor, an oxide semiconductor, or a 2D crystal structure semiconductor having a bandgap.

18. The semiconductor device of claim 1, further comprising:
a metal compound between the 2D material layer and the semiconductor layer.

19. The semiconductor device of claim 18, wherein the metal compound includes a metal oxide.

* * * * *